United States Patent [19]
Allen et al.

[11] Patent Number: 5,327,338
[45] Date of Patent: Jul. 5, 1994

[54] SCANNING LASER LITHOGRAPHY SYSTEM ALIGNMENT APPARATUS

[75] Inventors: Paul Allen; Mike Bohan; Tim Thomas, all of Beaverton; Robin Teitzel, Portland, all of Oreg.

[73] Assignee: ETEC Systems, Inc., Beaverton, Oreg.

[21] Appl. No.: 973,567

[22] Filed: Nov. 9, 1992

Related U.S. Application Data

[63] Continuation of Ser. No. 777,490, Oct. 15, 1991, abandoned, which is a continuation-in-part of Ser. No. 472,787, Jan. 31, 1990, abandoned.

[51] Int. Cl.$^5$ .............................................. B41J 2/435
[52] U.S. Cl. .................................................... 346/108
[58] Field of Search ................. 346/1.1, 76 L, 107 R, 346/108, 160; 250/492.2, 492.3

[56] References Cited

U.S. PATENT DOCUMENTS

| 3,903,735 | 9/1975 | Wilson . | |
| 4,142,401 | 3/1979 | Wilson . | |
| 4,717,644 | 1/1988 | Jones | 250/492.3 |
| 4,727,381 | 2/1988 | Bille et al. | 346/108 |
| 4,796,038 | 1/1989 | Allen et al. | 354/4 |
| 4,901,109 | 2/1990 | Mitome et al. | 355/68 |
| 4,962,318 | 10/1990 | Nishi | 250/548 |
| 4,974,736 | 12/1990 | Okunuki | 250/492.3 |
| 5,055,696 | 10/1991 | Hariachi | 250/492.2 |

OTHER PUBLICATIONS

Silicon Processing for the VLSI Era, vol. 1, Process Technology, Stanley Wolf and Richard N. Tauber, Lattice Press, 1987, pp. 493–505.

Primary Examiner—Mark J. Reinhart
Attorney, Agent, or Firm—Blakely Sokoloff Taylor & Zafman

[57] ABSTRACT

A direct-write lithography tool having improved alignment characteristics. The present invention discloses use of an optical alignment apparatus in a multi-beam lithography system. The optical alignment apparatus provides for alignment through a reduction lens utilized by the multi-beam lithography system for writing to semiconductor wafers and the like through use of optics for correction of distortion and curvature caused by viewing with a radiant energy beam of a different wavelength than the beams used for writing. Further, the alignment optics provide for multiple paths in a single optics system through use of liquid crystal retarders and beam splitters to direct the radiant energy beam through a selected optical path. In the present invention, a first optical path may provide for high magnification and a second for low magnification. Further, other optical paths may provide for bright or dark field illumination and viewing.

26 Claims, 11 Drawing Sheets

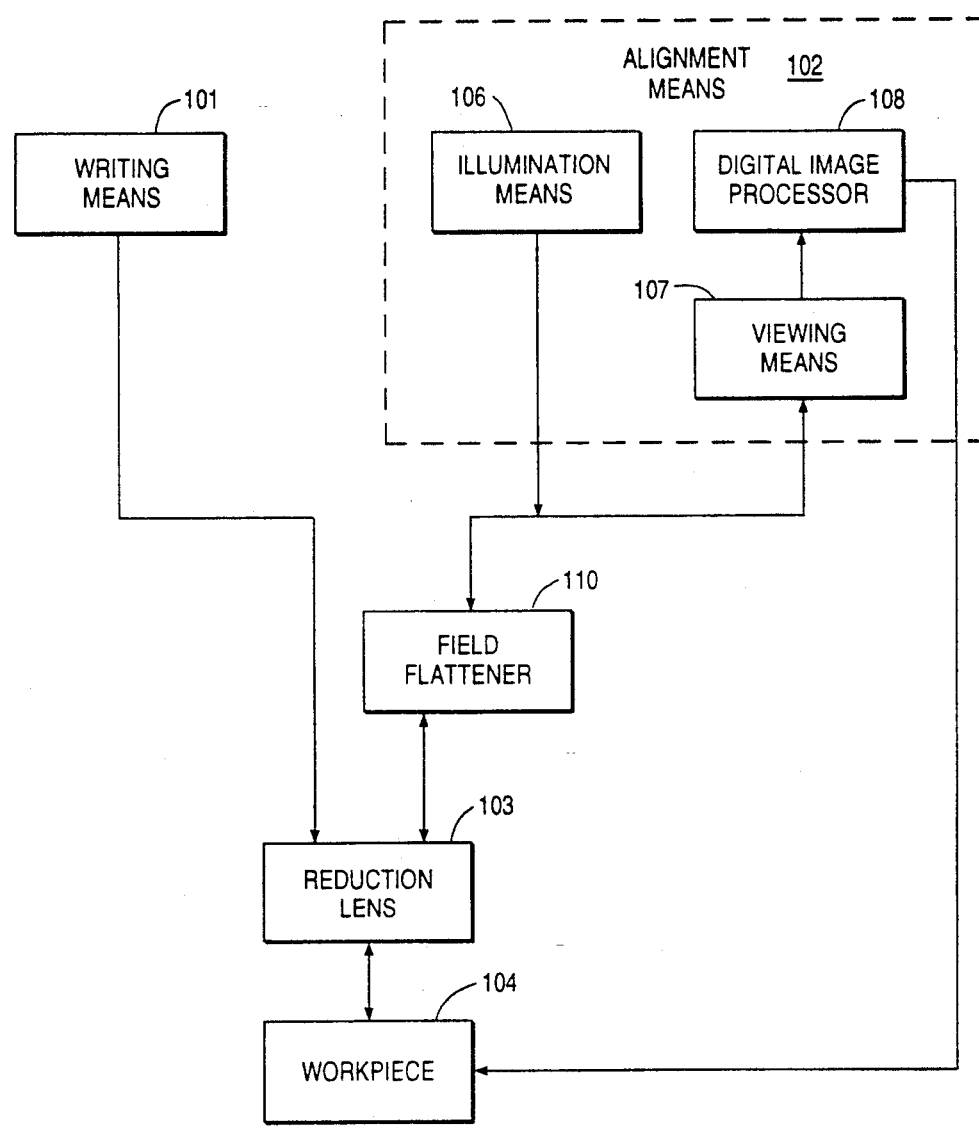

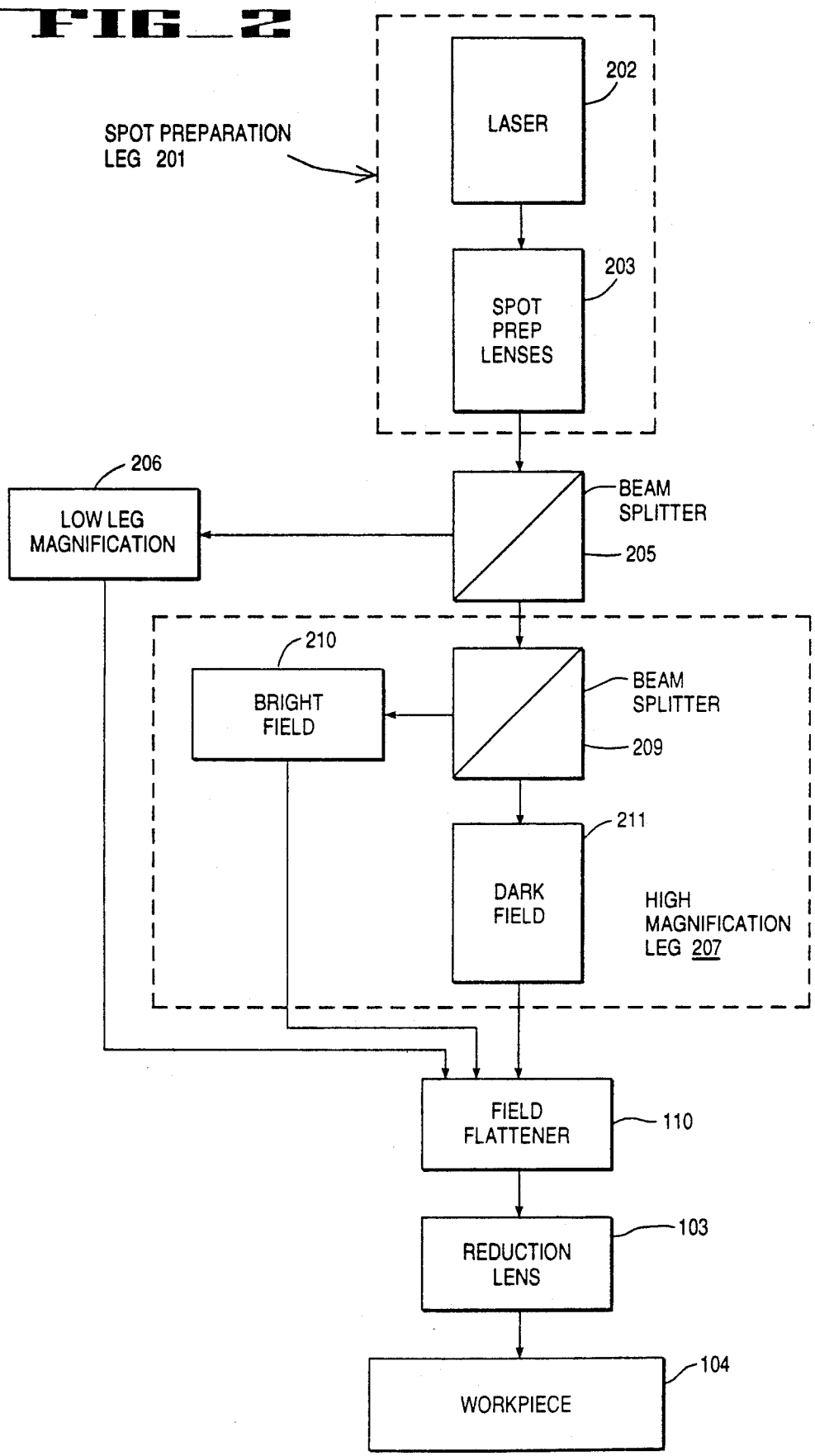

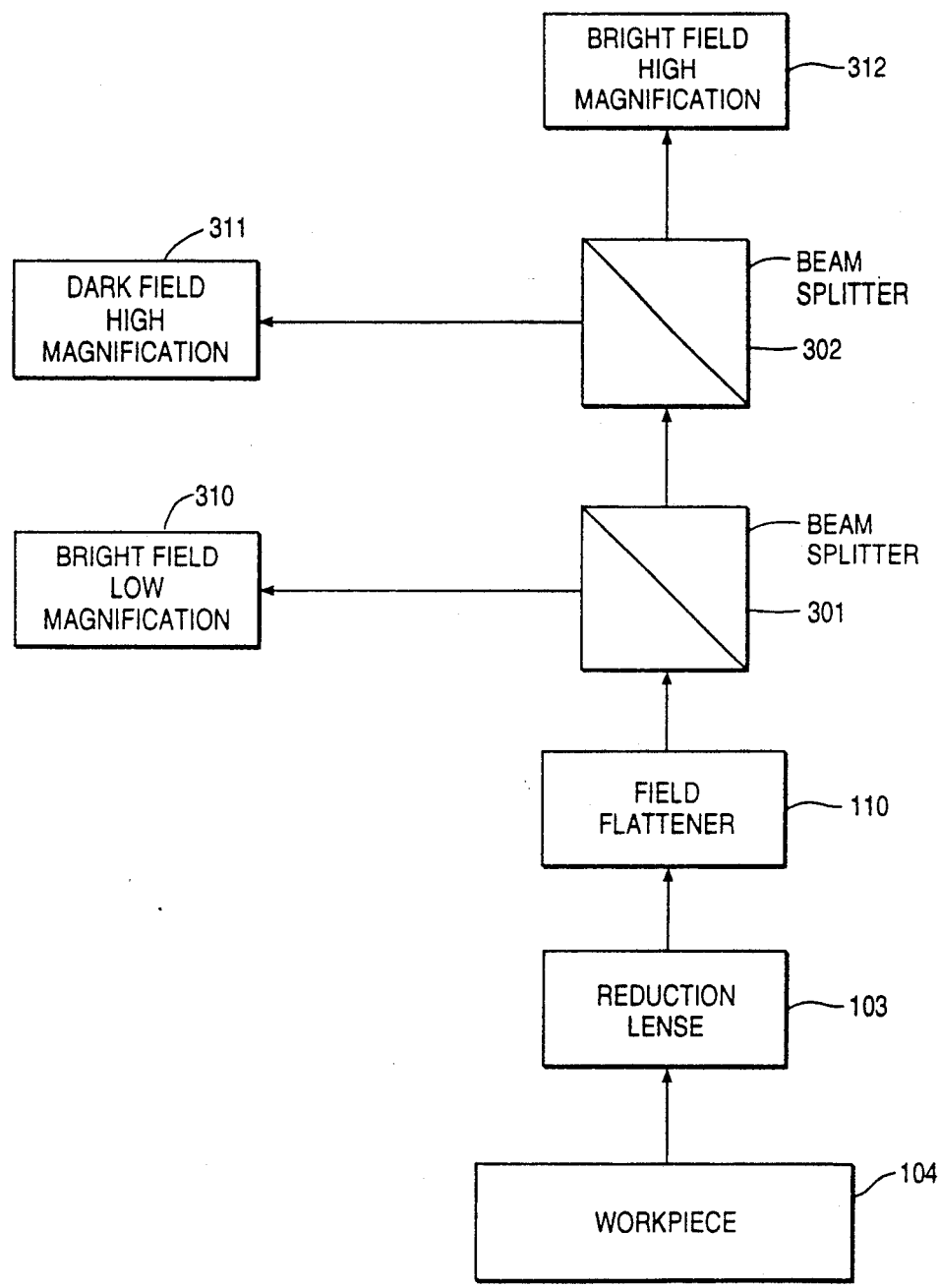

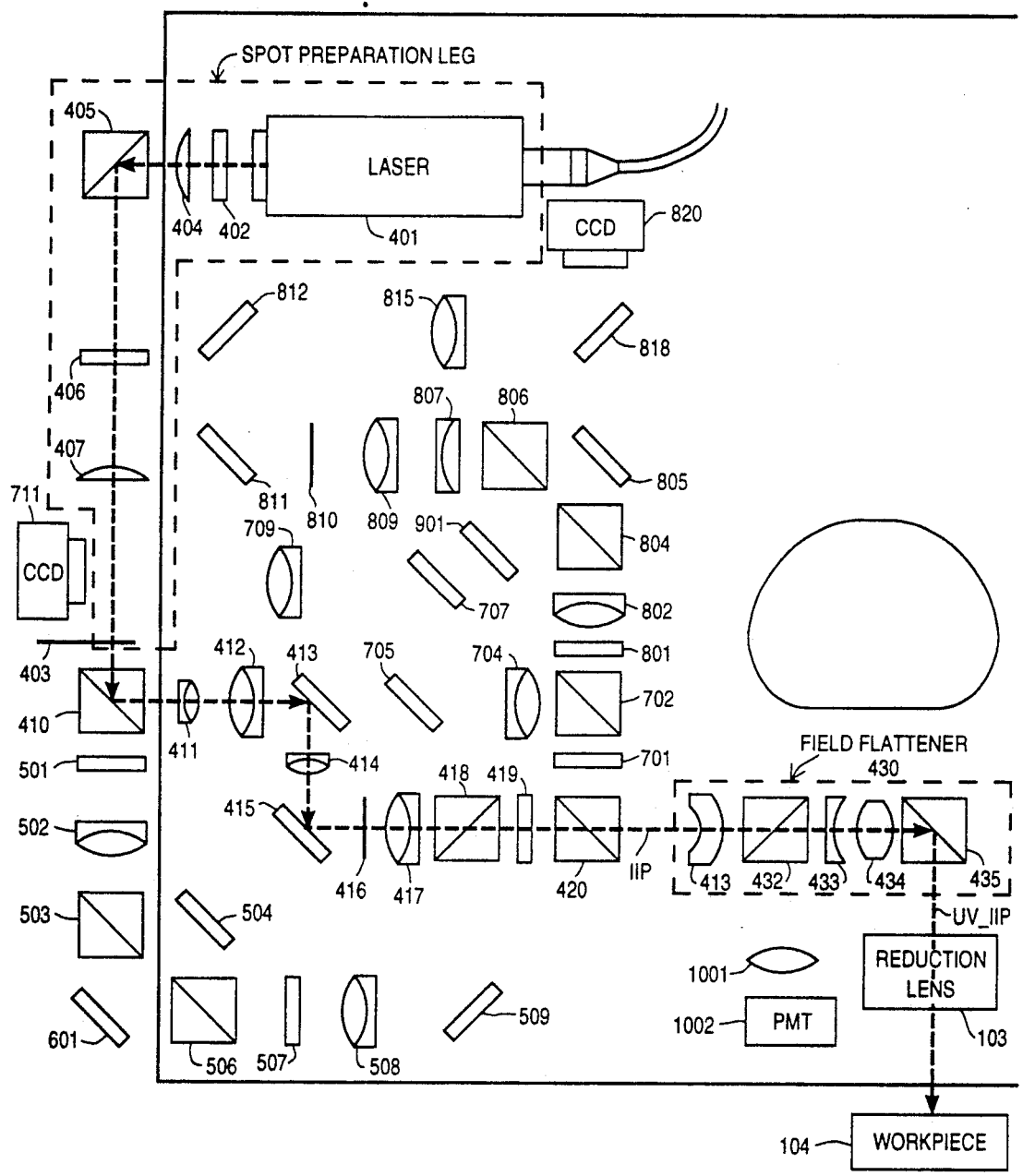
FIG_4

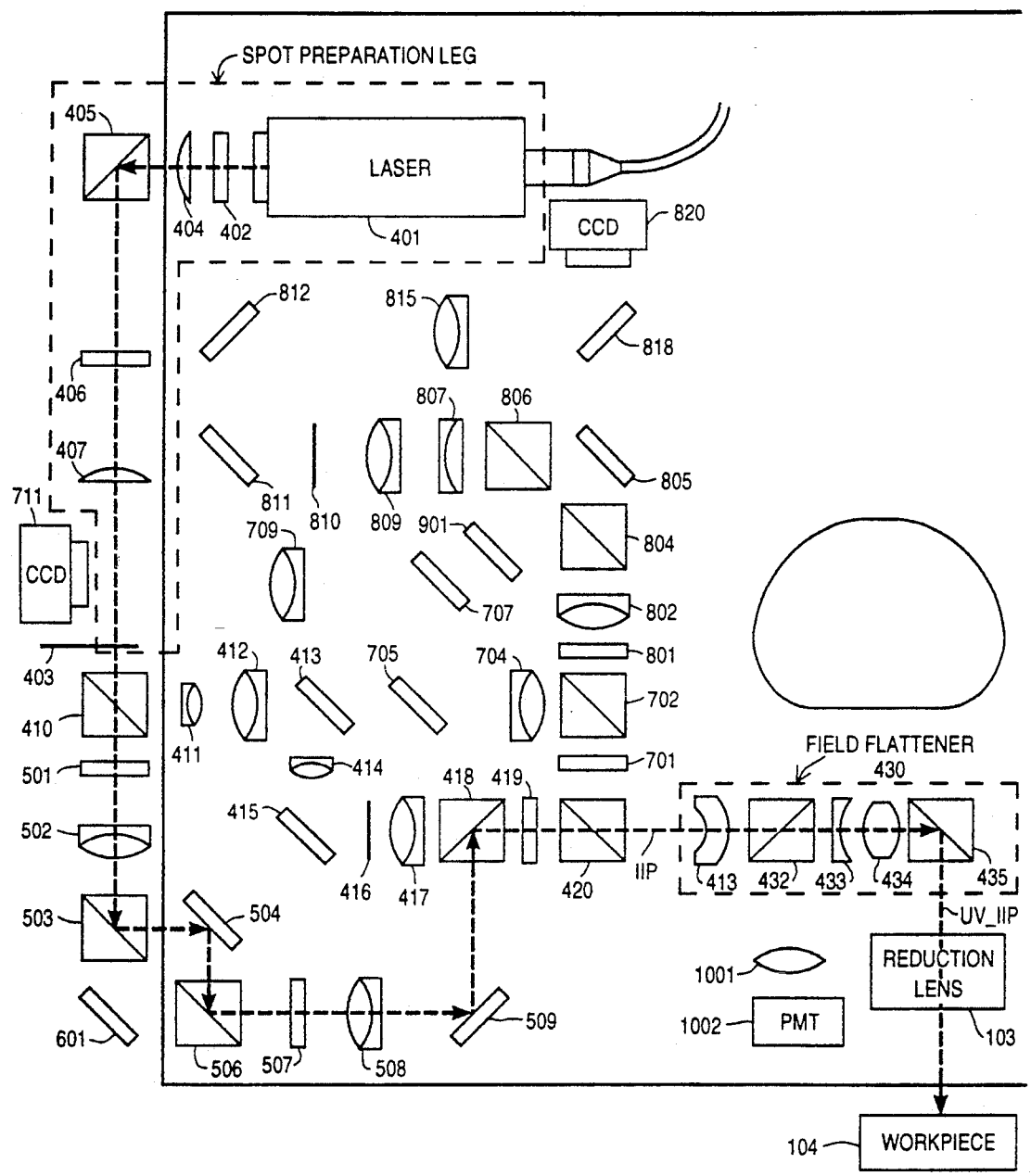

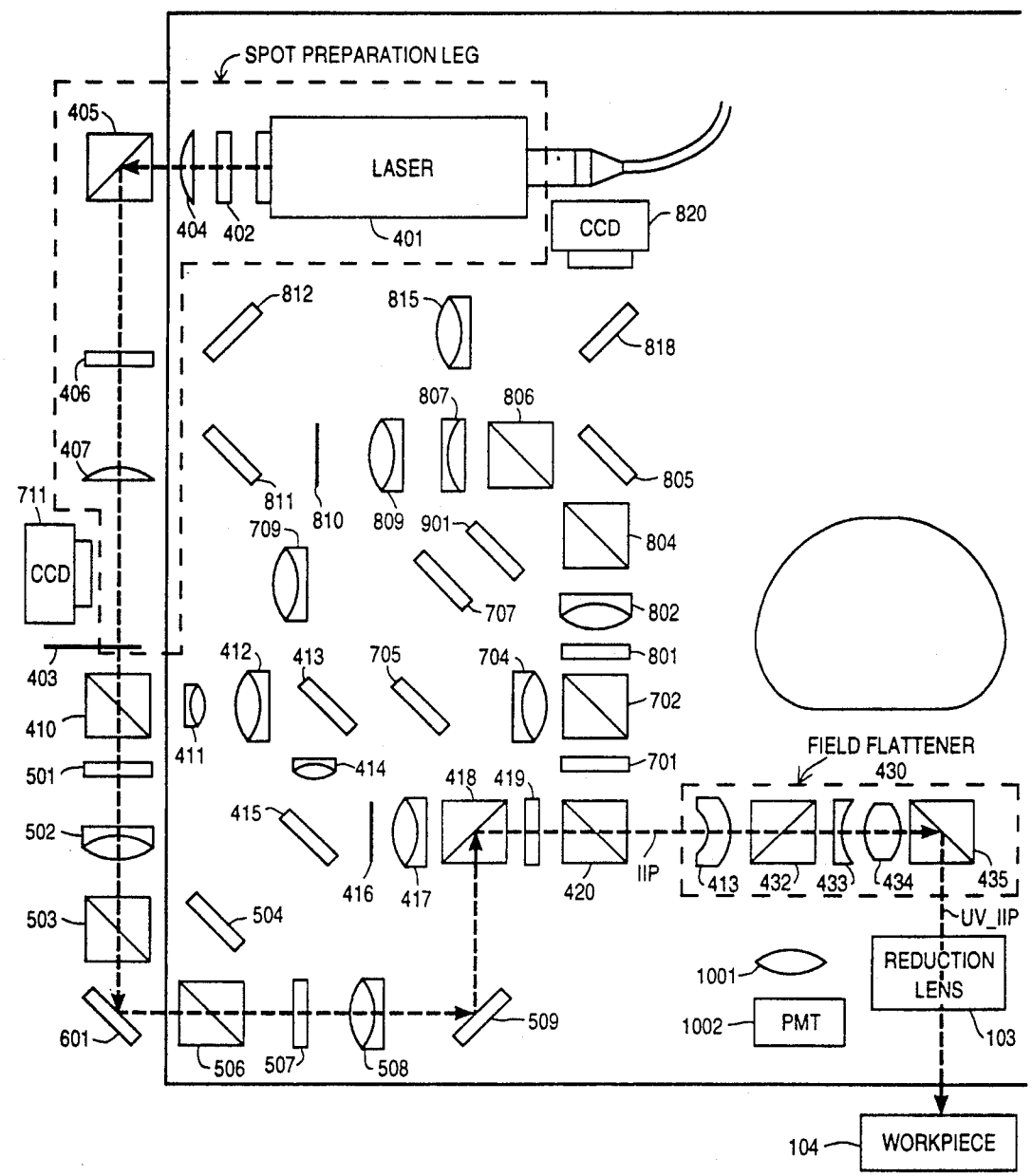

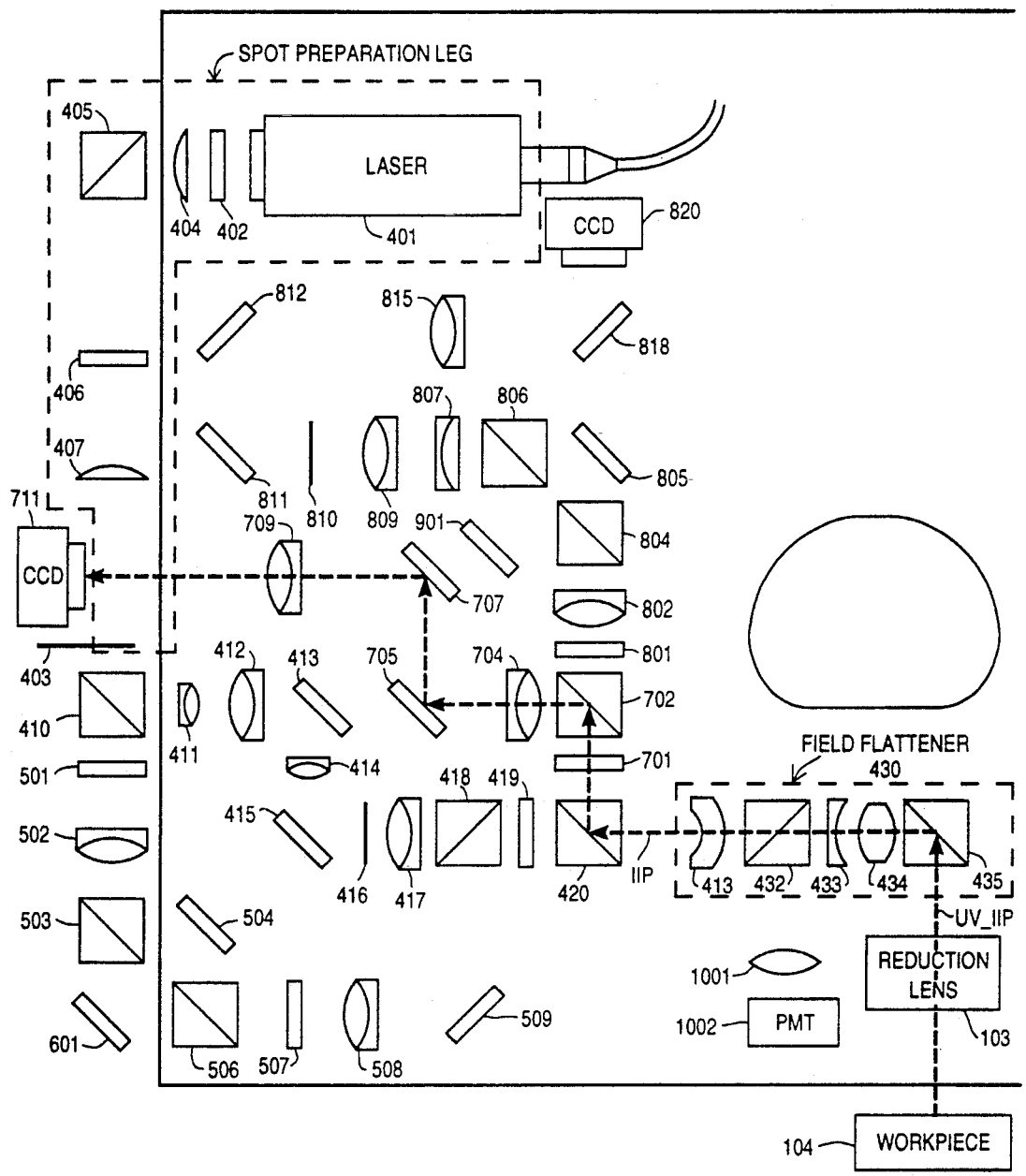
FIG_7

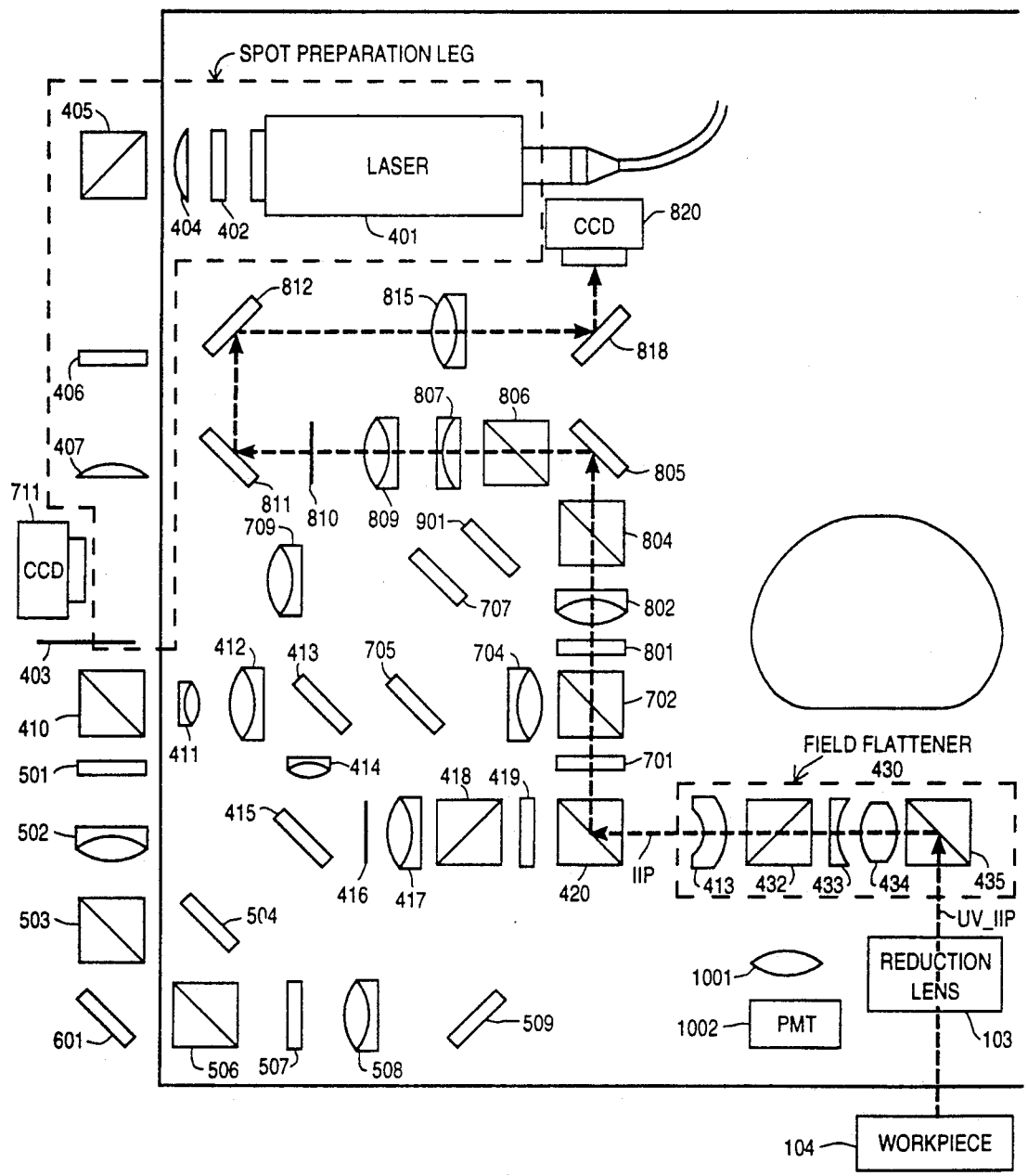
FIG_8

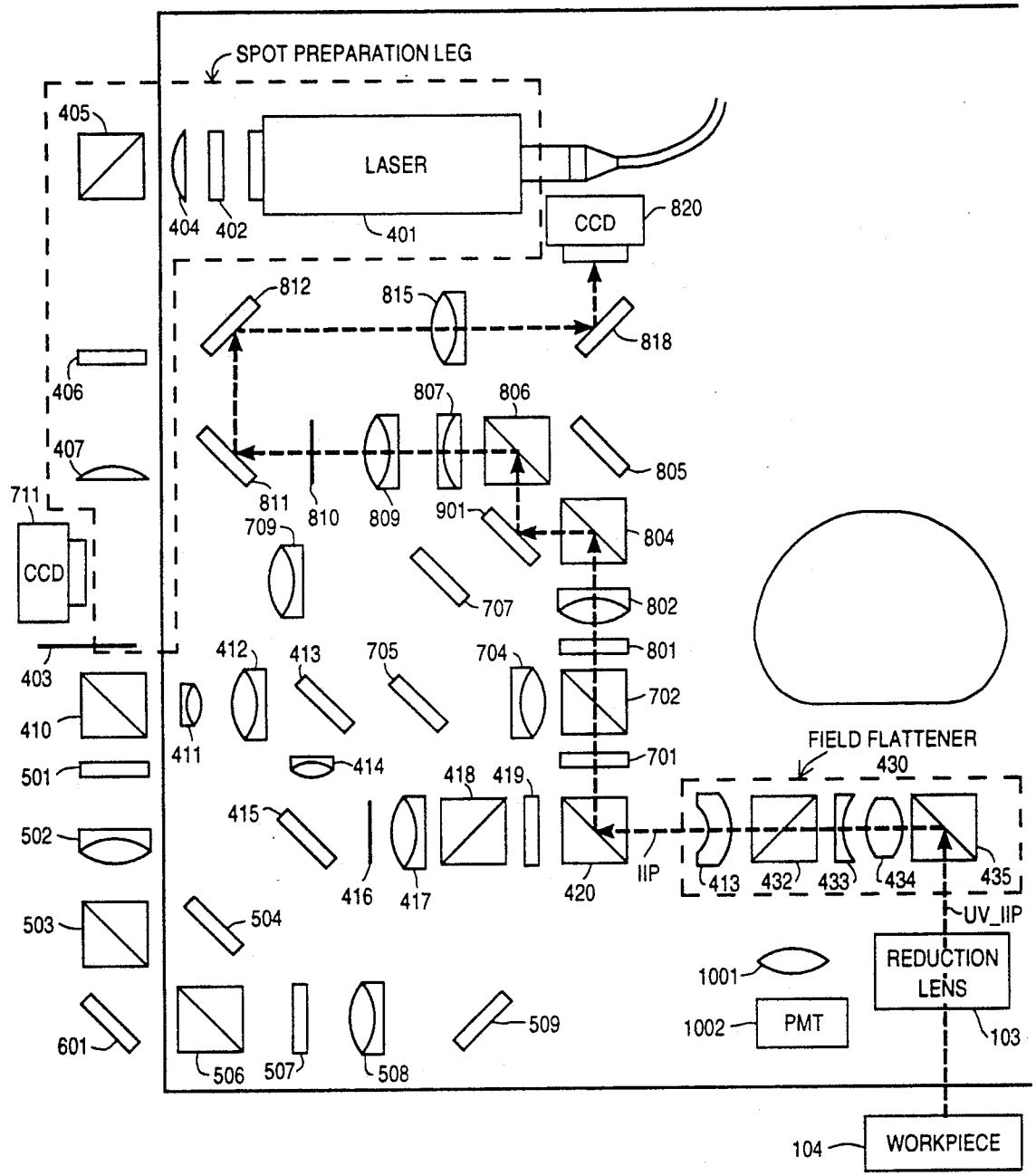
FIG_9

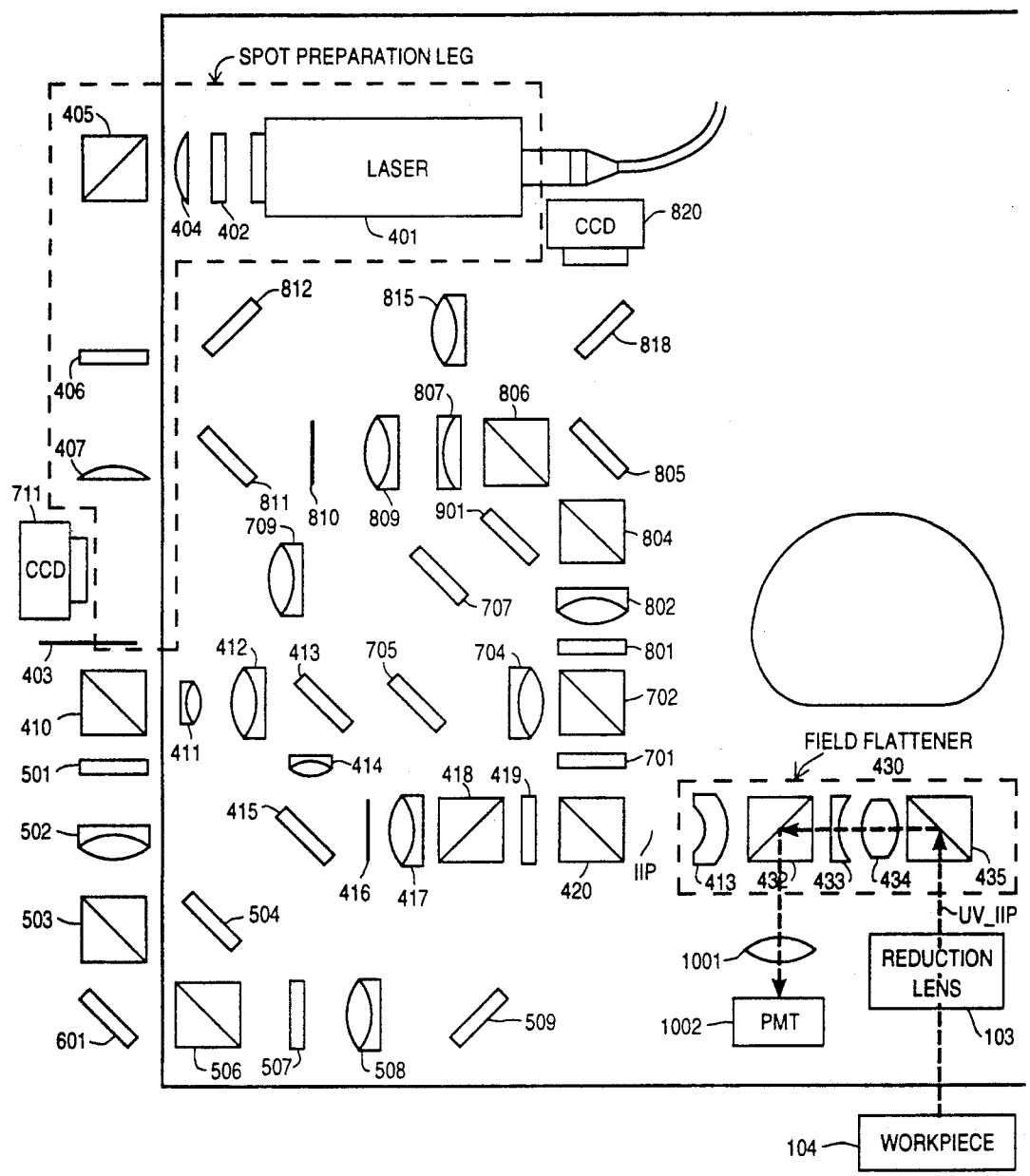

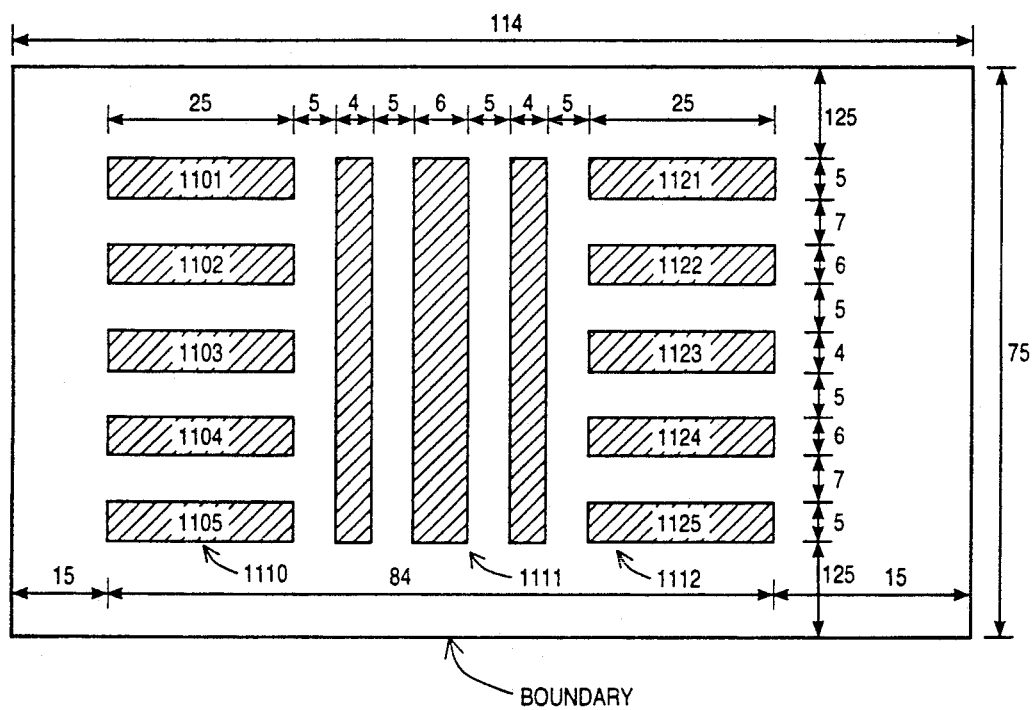
FIG_11

SCANNING LASER LITHOGRAPHY SYSTEM ALIGNMENT APPARATUS

This is a continuation of application Ser. No. 07/777,490, filed Oct. 15, 1991 now abandoned, which is a continuation of application Ser. No. 07/472,787, filed Jan. 31, 1990, now abandoned.

BACKGROUND OF THE INVENTION

1. Field of the Invention

The present invention relates to the field of alignment devices for scanned laser systems and has particular application in scanned laser lithography systems.

2. Description of the Related Art

A number of direct-write lithography systems for production of semiconductor wafers and the like are known in the art. In each of these systems, it is necessary to I1 position the wafer on a mechanical stage and accurately position the wafer under the write beam. Typically, registration marks are first written onto the substrate and subsequently such registration marks are utilized to determine the relative position of the wafer with respect to the alignment system. It may be worth noting that the registration marks may be applied on a global basis, on a die-by-die basis or on a field-by-field basis. In the case of registration marks being applied on a global basis, the wafer is accurately aligned and positioned with respect to the registration mark. In a global registration system, extreme stability of the system as well as flat, non-distorted wafers are required. In both die-by-die and field-by-field registration, the registration marks need to be applied in a manner and position compatible with the fabrication process.

In any event, what is important is the ability to accurately position a wafer with respect to a write beam in a direct-write lithography system. Therefore, as one objective of the present invention, an improved system for positioning of wafers in such a system is disclosed.

As a second objective of the present invention, improved alignment optics for presentation of relatively distortion-free images of a wafer is disclosed.

As a third objective of the present invention, an improved method for applying registration marks and an improved structure for said registration marks is disclosed.

SUMMARY OF THE INVENTION

The present invention discloses an alignment system for a semiconductor lithography tool. The alignment system is preferably utilized in a multiple-beam laser lithography system and provides for alignment of a semiconductor wafer or the like through the same reduction lens as utilized by the wilting beams of the lithography system. The system allows for measurement of the location of registration marks on wafers and alignment with the writing tool based on such measurements.

As one aspect of the present invention, the system provides for viewing and illumination with the alignment system through the reduction lens utilized by the writing beams. This is accomplished without adjustment to the writing beam; rather external optics are provided to correct lens distortion for the wavelength utilized by the alignment system.

The present invention further provides for multiple path illumination and viewing, e.g. bright field/dark field and high magnification/low magnification, in an integrated optical system. Liquid crystal retarders are provided to selectively choose an optical path for the light beam utilized by the alignment system.

Further, the present invention illustrates a unique registration marking allowing for symmetrical, non-periodic spacing of markings within the registration mark area.

BRIEF DESCRIPTION OF THE DRAWINGS

FIG. 1 is block diagram illustrating an overall view of the system of the present invention.

FIG. 2 is a block diagram illustrating the illumination means of the alignment optics of the present invention.

FIG. 3 is a block diagram illustrating the viewing means of the alignment optics of the present invention.

FIG. 4 illustrates the alignment optics of the preferred embodiment and specifically illustrates the blight field low magnification illumination leg of these optics.

FIG. 5 illustrates the alignment optics of the preferred embodiment and specifically illustrates the bright field high magnification illumination leg of these optics.

FIG. 6 illustrates the alignment optics of the preferred embodiment and specifically illustrates the dark field high magnification illumination leg of these optics.

FIG. 7 illustrates the alignment optics of the preferred embodiment and specifically illustrates the blight field low magnification viewing leg of these optics.

FIG. 8 illustrates the alignment optics of the preferred embodiment and specifically illustrates the bright field high magnification viewing leg of these optics.

FIG. 9 illustrates the alignment optics of the preferred embodiment and specifically illustrates the dark field high magnification viewing leg of these optics.

FIG. 10 illustrates the alignment optics of the preferred embodiment and specifically illustrates optical path of a light beam provided by a 363.8 nm laser for writing on a semiconductor wafer or similar medium.

FIG. 11 illustrates a registration mark as may be utilized by the present invention.

DETAILED DESCRIPTION OF THE PREFERRED EMBODIMENT

An alignment system for a scanned laser lithography tool is described. In the following description, numerous specific details are set forth such as specific circuits, layouts of lenses, etc., in order to provide a thorough understanding of the present invention. It will be obvious, however, to one skilled in the art that the present invention may be practiced without these specific details. In other instances, well-known circuits, structures and techniques have not been shown in detail in order not to unnecessarily obscure the present invention.

OVERVIEW OF THE LITHOGRAPHY SYSTEM OF THE PRESENT INVENTION

Referring first to FIG. 1, an overview of the lithography system of the present invention is shown in block diagram form. In the present invention, a writing means 101 is utilized to project an energy beam through a reduction lens 103 onto a workpiece 104, such as a semiconductor wafer. The writing means 101 may be of any of a number of conventional design and typically will supply a plurality of beams to the workpiece surface for scanning a scan area, for example in a raster scan technique.

An example of a laser system utilizing such a beam is described with reference to U.S. Pat. No. 4,796,038 titled *Laser Pattern Generation Apparatus* filed Mar. 28, 1988, issued Jan. 3, 1989 (the '038 reference) which is a continuation of Ser. No. 867,205 filed May 27, 1986, now abandoned, which is a continuation of Ser. No. 758,344, filed Jul. 24, 1985, now abandoned, each of which are assigned to the assignee of the present invention. The '038 reference describes a system having particular application in the generation of masks for semiconductor production. However, the '038 reference does teach a system comprising a radiant energy source, namely a laser, supplying a radiant energy beam to a beamsplitter which is provided through a series of lenses, mirrors and modulators to a reduction lens and a workpiece. Therefore, the teachings of the '038 reference are incorporated here by reference.

The present invention further relates to U.S. patent application titled On-Axis Air Gage Focus System, filed concurrently herewith and assigned to the assignee of the present invention, which application is incorporated here by reference.

Other references teach direct-write radiant energy source systems for semiconductor production. For example, S. Wolf and R. N. Tauber, *Silicon Processing for the VLSI Era, Volume 1, Process Technology*, Lattice Press, 1986 (reprinted with corrections, 1987), pp. 493-504, (the *Wolf* reference) teaches systems using focused electron beams for forming circuit patterns on semiconductor wafers. The *Wolf* reference is also incorporated here by reference.

An alignment means 102 is provided to allow alignment of a semiconductor wafer (i.e., workpiece 104) relative to the writing means. The alignment means 102 comprises an illumination means 106 and a viewing means 107. The illumination means 106 provides for illumination of the semiconductor wafer and is shown in more detail with reference to FIG. 2 and FIGS. 4-6. The viewing means 107 provides for viewing of the illuminated semiconductor wafer and is shown in more detail with reference to FIG. 3 and FIGS. 7-9.

The alignment means 102 allows measuring of the location of registration marks on a workpiece 104; based on the measurement of the location of the workpiece, means are provided for calibrating the radiant energy beams of the writing means 101 to the position of the workpiece.

Field flattener 110 is provided to allow use of the reduction lens 103 with both visible light used by the alignment means 102 and the exposing light used with the writing means 101. The field flattener 110 allows use of a reduction lens 103, which was designed for use with the exposing light, by a system such as the alignment system 102 of the present invention which was designed for use with visible light. Absent the use of the field flattener 110 of the present invention, it was found that the visible light produced and utilized by the alignment means 102 is both shifted and distorted. The field flattener 110 will be explained in more detail below.

Although variations are well within the scope of one of ordinary skill in the art, it is noted the reduction lens 103 provides for 20 times (20×) reduction and, in the preferred embodiment is specifically designed for use in connection with a writing laser source operating at a wavelength of 363.8 nm. As will be seen, absent correction disclosed by the present invention use of a reduction lens designed to create an undistorted image using a 363.8 nm source will lead to a shifted and distorted intermediate image plane when utilizing a visible light source for purposes of illumination of an alignment means.

It should be noted that writing means 101 may provide multiple radiant energy sources or, alternatively, a single source may be split into multiple beams. Additionally, the present invention provides for recognition of arbitrary shaped registration marks. It is further worth specifically pointing out one other aspect of the present invention which can be seen with reference to FIG. 1—the present invention provides for viewing and illumination through the same lens system as utilized for writing. This leads to a number of advantages in the system of the present invention.

OVERVIEW OF THE ILLUMINATION MEANS OF THE PREFERRED EMBODIMENT

Referring now to FIG. 2, a block diagram of the illumination means of the preferred embodiment is illustrated. (It should be noted that the viewing means of the present invention is not illustrated by FIG. 2; however, the viewing means preferably shares the reduction lens 103 for illuminating and viewing workpiece 104).

In the present invention, a radiant energy source such as microlaser 202 is utilized to provided at least one radiant energy spot to a preparation means, such as spot preparation lens assembly 203. The beam is then provided to beamsplitter means 205 from which it may be provided to a low magnification leg 206 or a high magnification leg 207.

The high magnification leg 207 provides for either bright field illumination through assembly 210 or dark field illumination through assembly 211. The beam is provided to either assembly 210 or assembly 211 through use of beamsplitter 209.

It is worthwhile to describe in more detail the use of the terms "bright field mode" and "dark field mode" and to explain the implementation surrounding these modes in the preferred embodiment. Bright field illumination occurs when the incident cone of light striking an illuminated spot on a surface, such as a semiconductor wafer, coincides with the reflected cone of light which is collected by a lens and imaged (for example by CCD 711 or CCD 820 of FIGS. 4-10). This occurs when light is specularly reflected from the wafer.

In contrast to being specularly reflected off a smooth surface, light may also be scattered off a rough surface or off a surface which has topological features. Most surfaces exhibit a mixture of specular and scattered reflection. Dark field illumination occurs when the incident cone of light and the reflected cone of light do not overlap. In dark field illumination, only scattered light is collected and imaged. The specularly reflected light is filtered out.

In the preferred embodiment of the present invention, dark field illumination may be described as an illumination process in which a work piece is illuminated with light corresponding to the outer portion of a bright field cone (i.e., the dark field cone is a subset of the bright field cone.) Light which is specularly reflected goes back into the outer portion of the cone. In the viewing leg, this portion of the cone is filtered out so that only the central portion of the cone is viewed. The only light which can enter the central portion of the cone is non-specularly reflected (i.e., scattered) light.

In summary, in bright field illumination the illumination cone and the viewing cone coincide. In dark field illumination the illumination cone and the viewing cone do not overlap. The term dark field arises from the appearance of a dark field image in which the background is dark and the edges or surface textures appear bright.

Typical applications realize optimal image and information from use of bright field illumination; however, use of dark field illumination enhances the visibility of details that may be lost through bright field illumination. Applications of dark field illumination include scanning a wide view field to find particles, scratches and chemical residues.

In the preferred embodiment of the present invention, aperture stops are provided in the optical path which determine the angle of the above-described cones. In general, the position and diameter of an aperture stop in an illumination leg determines the angle of cone of light which illuminates the wafer. The position and diameter of an aperture stop in the viewing leg determines the reflected cone angle which is collected and imaged by the viewing optics.

In order to obtain dark field illumination, the center of the dark field illumination leg's aperture stop is blocked (thus, blocking the center of the illumination cone at the work piece). Then, by blocking the outer portion of the reflected cone of light in the dark field viewing leg (by providing an aperture stop with a smaller radius than the aperture stop in the illumination leg), dark field illumination is achieved.

In the case of bright field illumination, aperture stops in both the illumination leg and viewing leg do not have the center blocked out and are of the same relative aperature radius. Thus, the illumination and viewing cones coincide.

In addition, in the preferred embodiment field stops are provided in the intermediate image planes to determine the size of the illuminated area at the wafer.

OVERVIEW OF THE VIEWING MEANS OF THE PREFERRED EMBODIMENT

FIG. 3 illustrates the viewing means of the present invention in block diagram form. Radiant energy, preferably in the form of visible light, from the illumination means described with reference to FIG. 2 is directed (either by specular reflection when in bright field mode or by scattering when in dark field mode) from the workpiece 104 through the reduction lens 103. From the reduction lens 103 the light is directed to beamsplitter 301 and, optionally, either to beamsplitter 302 or to bright field low magnification means 310 from which the resulting image is made available for viewing. Light directed to beamsplitter 302 is optionally directed to either bright field high magnification means 312 and the resulting image is made available for viewing or to dark field high magnification means 311 where the resulting dark field image is made available for viewing.

In the case of light directed to bright field low magnification means 310, a charge coupled device (CCD) TV camera capable of viewing the low magnification image is utilized. In the case of both the dark field high magnification means 311 and the bright field high magnification means 312, a CCD TV camera capable of viewing high magnification images is utilized. Preferably, a single high magnification CCD TV camera is utilized for both bright field and dark field images. It is of course obvious that alternative television cameras other than CCD devices may be utilized and further that such cameras may be developed which are capable of viewing both high and low magnification images with a single camera.

In the case of either high magnification viewing or low magnification viewing, the CCD cameras are coupled to provide the viewed image to a digital image processor (shown as digital image processor 108 of FIG. 1). The digital image processor measures the registration mark location and is coupled to provide control information for controlling the position of the workpiece (i.e., workpiece 104 of FIG. 1).

In the preferred embodiment, the spot produced by the microlaser 202 has a radius of 0.175 mm and the spot has a radius of 0.32 mm at a diffuser shown as diffuser 403 on FIG. 4, the end of the spot preparation leg of the system of the preferred embodiment. In high resolution mode for both bright and dark field, the spot has a radius of 0.55 mm at the intermediate image plane (shown as IIP on FIG. 4) and a radius of 0.0625 mm at the workpiece 104. In low magnification mode, the spot has a radius of 3.76 at the IIP and a radius of 0.47 at the workpiece 104. The high magnification viewing legs (both bright and dark field) have a spot radius at viewing camera (CCD 820 shown in FIGS. 4-10) of 5.5 mm and a magnification at CCD 820 of approximately 88× (i.e., 51.5 mm/0.0625 mm). The low magnification viewing leg produces a spot size at CCD 711 (shown in FIGS. 4-10) of 5.5 and, therefore, produces a magnification at CCD 711 of approximately 12× (i.e., 5.5 mm/0.47 mm). If the image is displayed on a monitor, the magnification is increased (or decreased) by the ratio of the diagonal length of the monitor to the diagonal length of the CCD detector (the CCD's in the preferred embodiment have a diagonal length of 11 mm).

The alignment optics of the preferred embodiment are described in more detail with reference to FIGS. 4-9. Specifically, FIG. 4 illustrates the alignment optics of the preferred embodiment and specifically illustrates the bright field low magnification illumination leg of these optics. FIG. 5 illustrates the alignment optics of the preferred embodiment and specifically illustrates the bright field high magnification illumination leg of these optics. FIG. 6 illustrates the alignment optics of the preferred embodiment and specifically illustrates the dark field high magnification illumination leg of these optics. FIG. 7 illustrates the alignment optics of the preferred embodiment and specifically illustrates the bright field low magnification viewing leg of these optics. FIG. 8 illustrates the alignment optics of the preferred embodiment and specifically illustrates the bright field high magnification viewing leg of these optics. FIG. 9 illustrates the alignment optics of the preferred embodiment and specifically illustrates the dark field high magnification viewing leg of these optics.

DETAILED DESCRIPTION OF THE ILLUMINATION SYSTEM OF THE PREFERRED EMBODIMENT

Referring now to FIG. 4, the alignment optics of the preferred embodiment are shown; as stated above, FIG. 4 specifically illustrates the bright field low magnification illumination leg of the preferred embodiment. However, prior to discussion of this specific leg, certain general aspects of the preferred embodiment alignment optics will be discussed.

Spot Preparation Leg

The alignment optics preferably utilize a solid-state narrow bandwidth 532 nm green microlaser 401 as a light source. The laser light is directed to a rotating grey ground glass diffuser 403 which serves to scatter the light produced by the laser 401. The rotation of the diffuser 403 acts to eliminate coherence effects such as fringes and speckles. The spot created by the laser beam is subsequently imaged (through the illumination optics) at the visible intermediate image plane and, ultimately, onto the wafer.

The laser 401 produces a beam which is provided to the diffuser 403. Liquid crystal retarder 402 is provided to allow continuous adjustment of the illumination intensity by adjusting the retardance of the liquid crystal retarder 402.

Although it is known to use lasers for scanning in lithography systems, use of a laser as taught by the present invention for a viewing system leads to a number of inventive advantages.

The liquid crystal retarder 402 is optically coupled to provide the light beam to lens 404, polarizing beamsplitter 405, liquid crystal retarder 406, lens 407 and finally diffuser 403. It should be noted that, in addition to adjusting the illumination intensity of the light source, liquid crystal retarder 402 controls the polarization of the light beam such that beamsplitter 405 will either allow the light beam to pass or will direct the beam at a 90° angle to liquid crystal retarder 406. Thus, liquid crystal retarder 402 may be utilized to strobe the light source. Use of liquid crystal retarders in the present invention to control polarization of the light beam and to direct the light down a particular light path when used in conjunction with polarizing beam splitters is discussed in greater detail below.

Liquid crystal retarder 406 is provided to control polarization of the light reaching polarizing beamsplitter 410. In the case of bright field low magnification illumination, the liquid crystal retarder 406 effects the beam such that beamsplitter 410 will reflect the beam at a 90° angle (s-polarization). Alternatively, the liquid crystal retarder 406 may effect the beam such that beamsplitter 410 allows the beam to pass through the beamsplitter 410 without deviation (p-polarization).

Use of Liquid Crystal Retarders

In general, as will be seen liquid crystal retarders are utilized in the present invention for a number of functions including the above-mentioned adjustment of illumination intensity, directing light along a desired path and strobing the illumination to effectively freeze any possible stage motion which may occur during a measurement. The liquid crystal retarders are operated under software control. In their application for directing light along a desired path, the retarders rotate the linearly polarized light's polarization vector. Depending on the orientation of the polarization, polarizing beam splitters are provided to either reflect the light at ninety degrees (90°), i.e, s-polarization, or to pass the beam without deviation, i.e, p-polarization.

Thus, use of liquid crystal retarders leads to at least three unique aspects of the present invention: (1) the present invention provides for non-mechanical switching between optical paths in a viewing alignment system; (2) the present invention provides for strobing of the illumination allowing capture of an image and avoiding problems caused by stage movement; and (3) the present invention allows for intensity control through use of retarders in a viewing alignment system.

It will be obvious to one of ordinary skill in the art that alternative means may be utilized to provide certain functions of the liquid crystal retarders of the preferred embodiment; however, such alternate means may lack certain advantages of the preferred embodiment and/or display certain characteristics not found in the preferred embodiment. For example, other crystals or mechanical means may be utilized to accomplish switching of the light beam from one path to another path.

Bright Field Low Magnification Illumination

As discussed above, beamsplitter 410 may direct the beam at a 90° angle through lens 411 and lens 412 to mirror 413. The beam is reflected from mirror 413 to lens 414 and mirror 415. The beam is then reflected from mirror 415 to half wave plate 416 through lens 417, beamsplitter 418, liquid crystal retarder 419 and beamsplitter 420.

As will be seen in connection with FIGS. 5 and 6, beamsplitter 418 is provided to allow a beam traveling the high magnification path (either bright field or dark field) to be reflected to liquid crystal retarder 419 at which point the paths for high magnification illumination and low magnification illumination join. Likewise, beamsplitter 420 is provided to reflect viewing beams to the viewing optical paths. The viewing optical paths are discussed in more detail with reference to FIGS. 7-9. Thus, beamsplitter 420 allows the viewing optics and illumination optics to share use of field flattener 430 and reduction lens 103 for purposes of illuminating workpiece 104 in the case of the illumination optics and for purposes of receiving the reflected and refracted light in the case of the viewing optics.

Field Flattener

As was discussed previously, in development of the present invention it was discovered that use of the reduction lens 103 used by the writing means 101 of FIG. 1 by the alignment optics of the present invention leads to an intermediate image plane which is both shifted and distorted. To correct this distortion and curvature, the field flattener 430 is provided. (It might be noted that it is known in the art to design color correction into the reduction lens; however in the present invention it was desired not to redesign the lens.) Use of field flattener 430 results in creation of an undistorted intermediate image for 532 nm light at the point labeled IIP (Intermediate Image Plane) in FIG. 4. The image at the point IIP corresponds to the image plane created by the writing laser (using 364 nm light) utilized by the present invention, labelled as point UV-IIP in FIG. 4. In concept, the 20× reduction lens 103 in conjunction with the disclosed field flattener 430 functions for 532 nm light in a manner similar to the reduction lens 430 alone using 364 nm light.

The field flattener is optically coupled between the beamsplitter 420 and the reduction lens 103; specifically, an optical path exists from the reduction lens 103 to beamsplitter 435, lens 434, lens 433, beamsplitter 432 and lens 431.

Bright Field High Magnification Illumination

Referring now to FIG. 5, the alignment optics of the preferred embodiment are shown and the optical path for bright field high magnification illumination is specifically illustrated. For bright field high magnification illumination the beam passes through the spot preparation leg of the alignment optics and is polarized by liquid crystal retarder 406 to allow the beam to pass through beamsplitter 410. Liquid crystal retarder 402 is controlled to adjust the illumination intensity of the beam.

After passing through the spot preparation leg, the polarization of the beam is adjusted by liquid crystal retarder 501 to cause the beam to be reflected at a right angle by beamsplitter 503 after passing through lens 502. The beam is then directed to mirror 504 and to beamsplitter 506. As will be seen with further reference to FIG. 6, beamsplitter 503 is provided to allow the high magnification illumination path to be split into two paths—bright field and dark field. Beamsplitter 506 is provided to allow the bright field and dark field optical paths to be merged.

From beamsplitter 506, the beam continues through liquid crystal retarder 507. In bright field mode, liquid crystal retarder 507 has no effect (i.e., zero retardance) on the beam. Then the beam passes through lens 508 and is reflected by mirror 509 and beamsplitter 418 to join the optical path illustrated for bright field low magnification illumination in FIG. 4.

Dark Field High Magnification Illumination

FIG. 6 illustrates the optical path of the preferred embodiment for providing dark field high magnification illumination. (It is noted that the preferred embodiment of the present invention does not provide for dark field, low magnification illumination or viewing; although this was not found to be necessary for the functions of the present invention it is obvious to one of ordinary skill in the art that alternative embodiments may provide for such illumination and viewing optical paths.)

The optical path for dark field illumination follows the same path as that for bright field high magnification illumination except liquid crystal retarder 501 is utilized to adjust the polarization of the light beam to allow the beam to pass through beamsplitter 503 and be reflected by mirror 601 to pass through beamsplitter 506. Retarder 507 re-orients the polarization of the beam when operating in dark field mode.

DETAILED DESCRIPTION OF THE VIEWING SYSTEM OF THE PREFERRED EMBODIMENT

Bright field low magnification viewing

Referring now to FIG. 7, the alignment optics of the preferred embodiment are again shown, in this case with specific illustration the bright field low magnification viewing leg of the preferred embodiment.

The light beam provided along the optical path illustrated by FIG. 4 is reflected by the workpiece 104 back through the reduction lens 103 and the field flattener assembly 430. This beam is then reflected by beamsplitter 420 to liquid crystal retarder 701 which adjusts the polarization of the beam to cause beamsplitter 702 to reflect the beam at a fight angle to lens 704. The beam is then reflected by mirror 705 to mirror 707 from which it is reflected through lens 709 to CCD TV camera 711.

As was discussed above, CCD TV camera 711 is utilized to provide the image to a digital image processor (shown as digital image processor 108 in FIG. 1).

Bright Field High Magnification Viewing

FIG. 8 illustrates the optical path for bright field high magnification viewing. The bright field high magnification illumination beam provided to workpiece 104 (as illustrated in connection with FIG. 5) is reflected from the workpiece 104 back through reduction lens 103 and field flattener assembly 430 as discussed in connection with FIG. 7.

The beam is then reflected at a right angle by beamsplitter 420 through liquid crystal retarder 701. Liquid crystal retarder 701 orients the polarization of the beam to allow the beam to pass through beamsplitter 702; from beamsplitter 702, the beam passes through liquid crystal retarder 801. Liquid crystal retarder 801 orients the polarization of the beam to allow the beam to pass through beamsplitter 804, after having passed through lens 802. The beam is then reflected by mirror 805 at a right angle and passes through beamsplitter 806, lens 807, lens 809 and field stop 810 to mirror 811, then to mirror 812, then through lens 815 and to mirror 818 where it is reflected to CCD TV camera 820.

Dark Field High Magnification Viewing

The optical path for dark field high magnification viewing is similar to the optical path for bright field high magnification viewing discussed above in connection with FIG. 8. Dark field viewing is discussed in greater detail with reference to FIG. 9. As illustrated in FIG. 9, the path for high magnification viewing for bright field and dark field is identical except liquid crystal retarder 801 orients the beam to cause beamsplitter 804 to reflect the beam at a right angle to mirror 901. Mirror 901 reflects the beam to beamsplitter 806 at which point the beam is again reflected to join the optical path described in FIG. 8 for bright field viewing.

UV LIGHT SOURCE

For purposes of illustration of perspective of the above-described optical paths in relation to the optical path of the writing beams of the system of the preferred embodiment, FIG. 10 illustrates the optical path of the 363.8 nm ultraviolet (UV) light laser beams used for writing on the wafer surface, i.e, on workpiece 104. The UV laser beams pass through beamsplitter 435, then through reduction lens 103 to workpiece 104. The beams, in addition to causing exposure of the photoresistive substrate of workpiece 104 are reflected back through lens 103 to beamsplitter 435, through lens 434 and 433 to beamsplitter 432. Beamsplitter 434 reflects the beam at a right angle through lens 1001 to photomultiplier tube 1002. Photomultiplier tube 1002 is utilized for calibration and position detection of the workpiece stage as discussed in the '038 reference.

It should be noted for purposes of clarification that lenses numbered 411, 412, 414, 417, 502, 508, 704, 709, 802, 807, 809 and 815 are doublet lenses. In the preferred embodiment each of the doublet lenses, except doublet lenses 704 and 802, are glued together. In the case of lenses 704 and 802, the lenses are physically separated by mechanical spacers.

THE REGISTRATION MARK OF THE PREFERRED EMBODIMENT

It is important to note that the present invention provides for alignment based on target location measurement, as opposed to direct referencing of wafer targets (or registration marks) to a reticle or mask. Methods of direct referencing are known in certain applications and may be described as "null detection" as opposed to the direct measurement technique of the present invention. The direct measurement technique of the present invention leads to a number of advantages. For example, when using a null detection technique it is typically only possible to determine whether the target wafer is properly aligned; however, it is not possible to determine precisely how far out of alignment the wafer is.

As another aspect of the present invention, a unique registration mark is disclosed. This registration mark is shown with reference to FIG. 11. The preferred registration mark is bounded in an area measuring 75×114 microns. Within the bounded area thirteen (13) rectangular blocks are written: five blocks 1101-1105 horizontally along the left-hand edge of the registration mark area, three blocks 1110-1112 are written vertically along approximately the center of the registration mark area, and five blocks 1121-1125 are written horizontally along the right-hand side of the registration mark area.

More specifically, blocks 1101-1105 are each offset 15 microns from the left boundary of the registration mark area. Each of blocks 1101-1105 are 25 microns wide; block 1101 is 5 microns high, block 1102 is 6 microns high, block 1103 is 4 microns high, block 1104 is 6 microns high and block 1105 is 5 microns high. Block 1101 is spaced 12.5 microns from the top boundary of the registration mark area; block 1102 is spaced 7 microns from block 1101 (for a total of 24.5 microns from the top boundary); block 1103 is spaced 5 microns from block 1102; block 1104 is spaced 5 microns from block 1103; block 1105 is spaced 7 microns from block 1104 and block 1105 is spaced 12.5 microns from the bottom edge of the registration area.

Likewise, blocks 1121-1125 are each offset 15 microns from the right boundary of the registration mark area. Each of blocks 1121-1125 are 25 microns wide; block 1121 is 5 microns high, block 1122 is 6 microns high, block 1123 is 4 microns high, block 1124 is 6 microns high and block 1125 is 5 microns high. Block 1121 is spaced 12.5 microns from the top boundary of the registration mark area; block 1122 is spaced 7 microns from block 1121 (for a total of 24.5 microns from the top boundary); block 1123 is spaced 5 microns from block 1122; block 1124 is spaced 5 microns from block 1123; block 1105 is spaced 7 microns from block 1124 and block 1125 is spaced 12.5 microns from the bottom edge of the registration area.

Block 1110 is spaced 5 microns from the right edge of blocks 1101-1105 (for a total of 45 microns from the left boundary of the registration mark area) and 12.5 microns from the top and bottom boundaries of the registration mark area and is 4 microns wide and 50 microns tall; block 1111 is spaced 5 microns from the right edge of block 1110 and is 6 microns wide and 50 microns tall; block 1112 is spaced 5 microns from the right edge of block 1111 (and 5 microns from the left edge of blocks 1121-1125) and is 4 microns wide and 50 microns tall.

Observation of the preferred registration mark shows that the mark is symmetrical and features non-periodic spacing in both the x and y directions leading to increased ability to detect the position, lines and features of the mark and allowing for increased accuracy in alignment and reduced errors due to noise over conventional registration marks.

Thus, a system for providing illumination, viewing and direct write capabilities for semiconductor processing applications or the like is described.

What is claimed is:

1. A direct-write multiple radiant energy beam lithography system for writing to a semiconductor substrate, comprising:
   (a) writing means for writing directly to said semiconductor substrate to form devices thereon, said writing means having a first radiant energy source for producing a first plurality of radiant energy beams, said first plurality of radiant energy beams being directed to said semiconductor substrate through a reduction lens; and
   (b) alignment means for aligning said semiconductor substrate wtih said radiant energy beams, said alignment means allowing for viewing a reflected image of said semiconductor substrate through said reduction lens.

2. The lithography system as recited by claim 1 wherein said alignment means comprising an optical alignment means.

3. The lithography system as recited by claim 1 wherein said alignment means comprises an illumination means for illuminating said substrate and a viewing means for viewing said illuminated substrate.

4. An apparatus for direct writing to a substrate, comprising:
   (a) writing means for writing directly to said substrate, said writing means having a first radiant energy source for producing a first radiant energy beam, said first radiant energy beam being directed to said substrate for producing devices thereon;
   (b) beam reduction means for reducing the diameter of said energy beam, said beam radiation means optically coupled with said writing means;
   (c) viewing means for viewing a reflected image of said substrate, said viewing means optically coupled to view said image through said beam reduction means.

5. The apparatus as recited by claim 4 wherein said writing means comprises a laser.

6. The apparatus as recited by claim 4 wherein said writing means comprises a scanned laser.

7. The apparatus as recited by claim 4 wherein said writing means comprises a multiple-beam scanned laser system.

8. The apparatus as recited by claim 4 further comprising an illumination means for illuminating said substrate.

9. The apparatus as recited by claim 8 wherein said illumination means is optically coupled to said beam reduction means.

10. The apparatus as recited by claim 9 wherein said illumination means comprises a second radiant energy source for producing a second radiant energy beam.

11. The apparatus as recited by claim 10 wherein said substrate comprises a photosensitive surface and second radiant energy source produces a radiant energy beam of a non-exposing wavelength for said photosensitive surface.

12. The apparatus as recited by claim 11 wherein said second radiant energy source is a laser source.

13. The apparatus as recited by claim 4 wherein said viewing means comprises recognition means for recognition of alignment marking means on said substrate.

14. The apparatus as recited by claim 13 wherein said recognition means is capable of recognition of arbitrary shaped marks on said substrate.

15. A direct-write lithography system for writing to a photosensitive substrate comprising:
   (a) a first radiant energy source producing a first radiant energy beam of a first wavelength, said first wavelength capable of exposure of said photosensitive substrate;
   (b) beam reduction means for reducing the size of said first radiant energy beam, said beam reduction means optically coupled with said first radiant energy source, said beam reduction means adapted to focus said first radiant energy beam;

(c) a second radiant energy source producing a second radiant energy beam of a second wavelength;

(d) correction means for correcting distortion and curvature of said second radiant energy beam, said correction means optically coupled between said second radiant energy source and said beam reduction means, said correction means further positioned away from and out of the optical path of said first radiant energy beam.

16. The lithography system as recited by claim 15 wherein said photosensitive substrate does not become exposed when radiated by a beam of said second wavelength.

17. The lithography system as recited by claim 16 further comprising viewing means for receiving radiant energy from said substrate optically coupled with said substrate through said beam reduction means and said correction means.

18. An alignment apparatus for a system for writing to a photosensitive substrate comprising:
(a) a radiant energy source producing a radiant energy beam;
(b) first means for directing said radiant energy beam over a first optical path to said substrate and for receiving from said substrate a reflection of said beam, said first means producing an image of a relatively low magnification;
(c) second means for directing said radiant energy beam over a second optical path to said substrate and for receiving from said substrate a reflection of said beam, said second means producing an image of a relatively higher magnification than produced by said first means.

19. An alignment apparatus for a system for writing to a photosensitive substrate comprising:
(a) a radiant energy source producing a radiant energy beam;
(b) first means for directing said radiant energy beam over a first optical path to said substrate and for receiving from said substrate a specular reflection of said beam, said first means producing a bright field image;
(c) second means for directing said radiant energy beam over a second optical path to said substrate and for receiving from said substrate a scattered reflection of said beam, said second means producing a dark field image.

20. An alignment apparatus for a system for writing to a photosensitive substrate comprising:
(a) a radiant energy source producing a radiant energy beam;
(b) first means for directing said radiant energy beam over a first optical path to said substrate;
(c) second means for directing said radiant energy beam over a second optical path to said substrate
(d) polarization retarders for selectively directing said radiant energy beam over said first optical path or said second optical path.

21. The alignment apparatus as recited in claim 20 wherein said retarders comprise liquid crystal retarders.

22. A semiconductor substrate, said substrate providing area for formation of circuits thereon by processing equipment, said substrate requiring alignment with said processing equipment during formation of said circuits, said substrate having thereon a registration mark for aligning said substrate, said registration mark comprising:
a registration mark area;
a plurality of markings aligned to provide symmetrical non-periodic spacing of said markings within said registration area.

23. The registration mark as recited by claim 22 wherein said each of said plurality of markings comprises a rectangular marking.

24. The registration mark as recited by claim 22 wherein said plurality of markings are aligned to provide symmetrical non-periodic spacing of said markings in both x and y coordinates within said registration area.

25. A direct-write multiple radiant energy beam lithography system for writing to a substrate, comprising:
(a) writing means for writing directly to said substrate, said writing means having a first radiant energy source for producing a first plurality of radiant energy beams, said first plurality of radiant energy beams for scanning said substrate to effect said writing; and
(b) alignment means for aligning said substrate with said radiant energy beams, said alignment means illuminating said substrate using full-field imaging to substantially illuminate the entire surface of said substrate.

26. The lithography system of claim 25 further wherein said alignment means further comprises viewing means for viewing said substrate, said viewing means receiving light reflected from said substrate.

* * * * *